US005673182A

United States Patent [19]

Garner

[11] Patent Number: 5,673,182
[45] Date of Patent: Sep. 30, 1997

[54] SUPPORT FRAME ASSEMBLY FOR A PRINTED CIRCUIT CARD HAVING A TIE BAR BRIDGING ACROSS THE FRAME

[75] Inventor: Robin E. Garner, Glendale, Ariz.

[73] Assignee: Honeywell Inc., Minneapolis, Minn.

[21] Appl. No.: 718,639

[22] Filed: Sep. 17, 1996

[51] Int. Cl.$^6$ .................. H02B 1/01; H05K 7/18
[52] U.S. Cl. .................. 361/829; 361/737; 361/740; 361/752; 361/757; 361/759; 361/801; 361/750
[58] Field of Search .................. 361/726–728, 361/732, 736–737, 740, 747–748, 750–751, 752, 759, 801–802, 829, 825; 235/441, 486

[56] References Cited

U.S. PATENT DOCUMENTS

| | | |
|---|---|---|
| 5,313,364 | 5/1994 | Omori et al. .................. 361/737 |
| 5,402,095 | 3/1995 | Janniere .................. 235/441 |
| 5,481,434 | 1/1996 | Banakis et al. .................. 361/756 |
| 5,563,772 | 10/1996 | Nichols .................. 361/752 |

*Primary Examiner*—Leo P. Picard
*Assistant Examiner*—Anthony Dinkins
*Attorney, Agent, or Firm*—Ohlandt, Greeley, Ruggiero & Perle

[57] ABSTRACT

The assembly comprises a U-shaped frame to which the card may be secured. The frame is defined by spaced parallel side elements and a connecting end element. Intermediate the ends of the frame a tie bar bridges flatly across the top of the frame and is adapted to hold down the card and tie the side elements together. The bar has downward legs at its opposite ends secured to the frame.

15 Claims, 1 Drawing Sheet

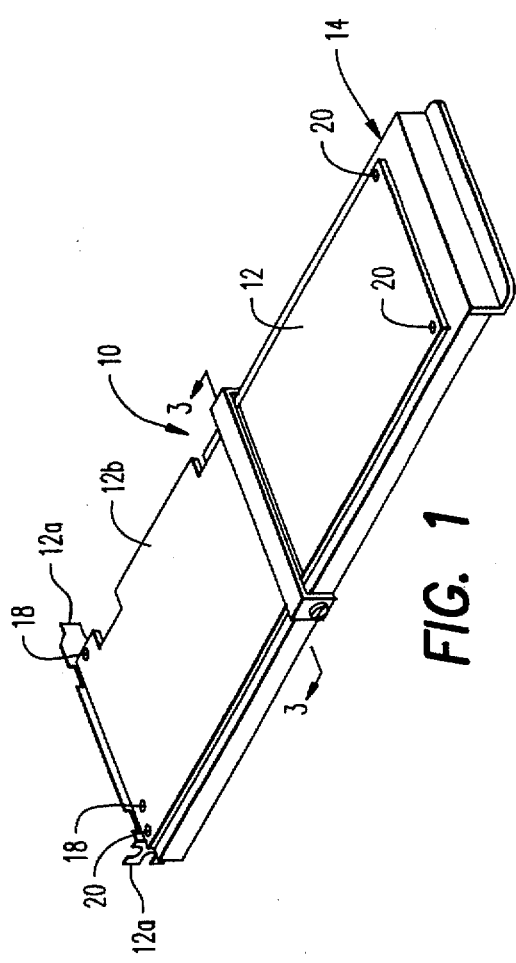
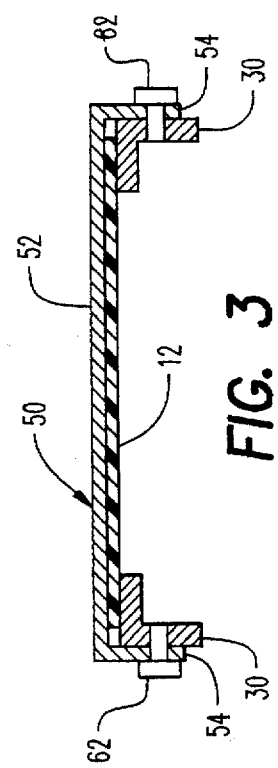
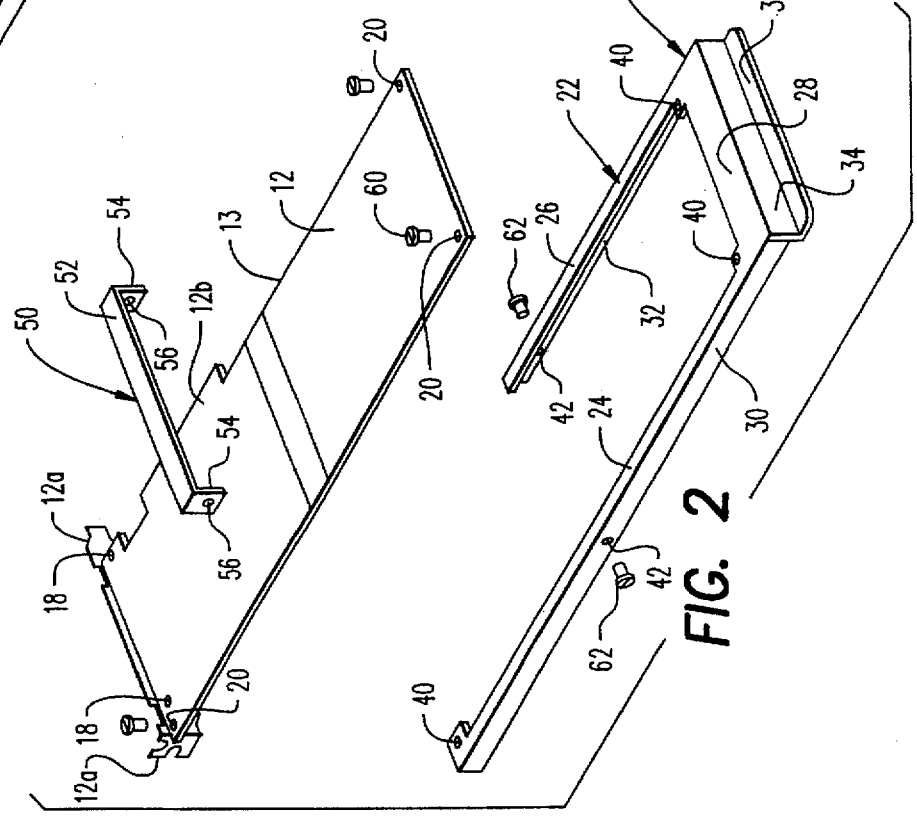

1

SUPPORT FRAME ASSEMBLY FOR A PRINTED CIRCUIT CARD HAVING A TIE BAR BRIDGING ACROSS THE FRAME

This invention relates to a support frame assembly for a standard length (as opposed to short) printed circuit card. More specifically, the invention relates to such an assembly wherein the card is supported by its perimeter so as to not interfere with the functioning of the card.

BACKGROUND OF THE INVENTION

It has been noted that standard length printed circuit cards containing surface-mounted electronic devices sustain damage when shipped installed in a computer chassis. Damage, usually in the form of broken and cracked leads, has been caused by vibratory and shock forces during shipping.

Attempts have been made in the past when using printed circuit cards of standard size to provide structural support internally of the board to avoid such damage. While this helps to avoid failure, such a solution has been objectionable in that the support has consumed valuable real estate internal to the board, that is, space which could be used for circuitry. External circuit board single edge stiffeners, as another approach, have comprised rigid layers attached by means of mechanical hardware or solder joints. However, such stiffening has run counter to the industry—mandate against encumbrances disposed internally of the edges of the board where space is at a premium. Single edge stiffeners which control or limit displacements (rotational and translational) along one axis of the circuit card have also not avoided failure.

There has been a definite need for acceptable support for standard cards, and it is such a need which is addressed by the present invention cards which controls or limits displacements (rotational and translational) along two axes of the circuit card.

SUMMARY OF THE INVENTION

The present invention provides a support frame assembly for a standard (as opposed to short) peripheral component interconnect (PCI) card. It comprises a U-shaped frame defined by spaced parallel side elements and a connecting end element at one end. The frame has a flat top. At the perimeter of the U-shaped frame and along the side elements and end elements are downward stiffening flanges extending therealong. Threaded openings are formed in the flat top in alignment with openings in the card, and the flanges of the respective side elements are formed with aligned threaded openings intermediate their ends.

A tie bar bridges flatly across the top of the frame and has downward legs at its opposite ends, the tie bar being dimensioned to have its legs secured against the outside of the flanges of the respective side elements. The bar is thus adapted to overlie the card and hold it against the frame. Threaded fasteners passing through the openings in the card engage the threaded openings respectively in the frame. Further threaded fasteners extend respectively through openings in the legs of the tie bar and engage the threaded openings in the flanges of the side element.

Further objects and features of the invention will be apparent from the following specification and drawings, all of which disclose a non-limiting embodiment of the invention.

BRIEF DESCRIPTION OF THE DRAWINGS

FIG. 1 is a perspective view of a supported printed circuit board embodying the invention;

FIG. 2 is a perspective exploded view; and

FIG. 3 is a sectional view taken on the line 3—3 of FIG. 1.

DESCRIPTION OF THE PREFERRED EMBODIMENT

A supported standard printed circuit board embodying the invention is shown in FIG. 1 and generally designated 10. It comprises the standard PCI card 12 with the usual riveted-to-the-card ISA retainer or card extender removed. It also comprises a support frame assembly generally designated 14.

The card, as is well known in the art, is of flat multi-layered rectangular configuration. At one end are the usual slot plate/card brackets 12a for sealingly disposing card 12 within a computer chassis (not shown). Apertures 18 are normally formed in the card and used to attach slot plate/card bracket 12a. An electrical connector 12b extends outward from the rectangular configuration of the card.

The three of the four corners of the card are formed with openings 20 for purposes which will appear. In the exploded view (FIG. 2) the frame assembly comprises a generally U-shaped frame 22 having parallel side elements 24 and 26 and a connecting end element 28. Side element 26 is shorter than side element 24. The top surface of the frame is flat to receive the card 12 thereagainst. The side elements 24, 26 and the end element 28 at their perimeter are formed with downward stiffening flanges 30, 32 and 34, respectively, and the flange 34 of the end element is formed with a guide-engaging outward rib 36 at its lower end. Threaded openings 40 are formed in the frame in alignment with the openings 20 in the card. Preferably, the openings may be in the form of pressed-in threaded locking inserts well known in the art.

Intermediate the ends of the side elements 24, 26 threaded openings 42 are formed in alignment. These threaded openings may also be in the form of pressed-in threaded locking inserts. The top surfaces of side elements 24 and 26 that contact the bottom surfaces of card 12 may be coated with or have applied electrically insulating material to avoid interference with the circuit.

A bridging tie bar 50 is provided and includes the horizontal span 52 and the two legs 54 extending perpendicularly downward therefrom. The legs are formed with openings 56. The underside of the span 52 may be coated with or have applied electrically insulating material to avoid interference with the circuit where the tie bar overlies the card 12 (shadowed area). The electrically insulating material also prevents potential abrasion damage to the circuit in the event of relative motion between bridging tie bar 50 and card 12 due to externally applied vibratory forces.

In assembly, the card 12 is brought over the U-shaped frame 22 so that the openings 20 align with the threaded openings 40. Threaded fasteners 60 are made to extend through the openings 20 respectively and threadedly engage the threaded openings 40 to secure the card to the frame. The tie bar 50 is brought down to superpose against the card, and the openings 56 in the tie bar are aligned with the openings 42 in the frame. Threaded fasteners 62 are made to extend through the openings 56 and threadedly engage in the threaded openings 42 respectively.

Those skilled in the art can infer the reason that the side element 26 is shorter than side element 24 so as to allow electrical connector 12b disposed about at least a portion of the edge 13 of card 12 to be readily inserted into a female electrical receptacle (not shown) disposed within a computer chassis.

In installation into the computer, the supported card 10 is maneuvered into place with the guide-engaging rib 36 fitting into the usual card-retaining guide and electrical connector elements 12b are inserted into a female receptacle (not shown). Suitable fasteners (not shown) cooperating with the usual card brackets 12a secure the card in the computer. Electrical connections are made to the connectors 12b on the card as is conventional.

Preferably, the insulating layer on the underside of the span 52 may be a film of 1 mm or 2 mm thick Kapton plastic insulating coating, or it can be polyester tape. This will prevent electrical short circuits.

The frame 22 is constructed of aluminum alloy 5052-H32, 0063" thick. The tie bar 50 is also aluminum and acts to hold the board to the support frame and tie the side elements 24, 26 of the support frame together.

Variations in the invention are possible. Thus, while the invention has been shown in only one embodiment, it is not so limited but is of a scope defined by the following claim language which may be broadened by an extension of the right to exclude others from making, using or selling the invention as is appropriate under the doctrine of equivalents.

What is claimed is:

1. A support frame assembly for an elongate printed circuit card having electrical connectors along at least a portion of one edge of said card and opening respectively adjacent at least three corners of the card, the frame assembly comprising:
   a. a generally U-shaped frame defined by spaced parallel side elements and a connecting end element, the frame having a flat top, the perimeter of the side elements and end element having downward stiffening flanges extending therealong, threaded openings formed in the flat top in alignment with the openings in the card, the flanges of the respective side elements formed with aligned threaded openings intermediate their ends,
   b. a tie bar bridging flatly across the top of the frame and having downward legs at its opposite ends, the tie bar being dimensioned to have its downward legs secured to the outside of the flanges of the respective side elements and thereby having a surface adapted to overlie the card and hold it against the frame, and
   c. threaded fasteners adapted to pass through the openings in the card and to threadedly engage the threaded openings respectively in the frame and also extending respectively through the openings in the legs of the tie bar and threadedly engage the threaded openings in the flanges of the side elements.

2. A support frame assembly as claimed in claim 1 wherein the surface of the tie bar adapted to overlie the frame is formed of electrically insulating material.

3. A support frame assembly as claimed in claim 1 wherein the tie bar is of metal and the surface disposed opposite said card being coated with an electrically insulating coating.

4. A support frame assembly as claimed in claim 1 wherein the frame is made of aluminum.

5. A support frame assembly as claimed in claim 1 wherein the flange on the end element has at its lower end a guide-engaging outward rib.

6. A support frame assembly as claimed in claim 1 wherein one of the side elements is shorter than the other so as to allow said electrical connector to not be covered by said respective side element.

7. A support frame assembly as claimed in claim 1 wherein the top surfaces of said side elements disposed opposite said card being coated with an electrically insulating material.

8. A supported elongated printed circuit card comprising:
   a. an elongate printed circuit card having electrical connectors along at least a portion of one edge of said card, and openings respectively adjacent at least three corners of the card,
   b. a generally U-shaped frame defined by spaced parallel side elements and a connecting end element, the frame having a flat top, the perimeter of the side elements and end element having downward stiffening flanges extending therealong, threaded openings formed in the flat top in alignment with the openings in the card, the flanges of the respective side elements formed with aligned threaded openings intermediate their ends,
   c. a tie bar bridging flatly across the top of the frame superposing the card and having downward legs at its opposite ends, the tie bar being dimensioned to have its downward legs against the outside of the respective flanges of the side elements and thereby being adapted to overlie the card and hold it against the frame, and
   d. threaded fasteners passing respectively through the openings in the card and threadedly engaging the threaded openings in the frame and also passing respectively through the openings in the legs of the tie bar and threadedly engaging the threaded openings in the flanges of the side elements.

9. A supported elongated printed circuit card as claimed in claim 8 wherein the surface of the tie bar overlying the card is formed of electrically insulating material.

10. A supported elongated printed circuit card as claimed in claim 9 wherein the tie bar is of metal and the surface disposed opposite said card being coated with an electrically insulating coating.

11. A supported elongated printed circuit card as claimed in claim 8 wherein the frame is made of aluminum.

12. A supported elongated printed circuit card as claimed in claim 8 wherein the flange on the end element has at its lower end a guide-engaging outward rib.

13. A supported elongated printed circuit card as claimed in claim 8 wherein one of the side elements is shorter than the other.

14. A supported elongated printed circuit card as claimed in claim 8 wherein the top surfaces of said side elements disposed opposite said card being coated with an electrically insulating material.

15. A supported elongated printed circuit card which comprises a support frame comprising a pair of oppositely disposed side elements and a connecting end element, and a tie bar securingly disposed between said oppositely disposed side elements, so as to hold down said card and connect said oppositely disposed side elements together.

* * * * *